US010897229B1

(12) United States Patent
Zhang et al.

(10) Patent No.: US 10,897,229 B1
(45) Date of Patent: Jan. 19, 2021

(54) COMPENSATION CIRCUIT FOR OPERATIONAL AMPLIFIER, INTEGRATED CIRCUIT AND DISPLAY PANEL

(71) Applicant: SeeYA Optronics Co., Ltd., Shanghai (CN)

(72) Inventors: Haodong Zhang, Shanghai (CN); Ping-Lin Liu, Shanghai (CN)

(73) Assignee: SeeYA Optronics Co., Ltd., Shanghai (CN)

( * ) Notice: Subject to any disclaimer, the term of this patent is extended or adjusted under 35 U.S.C. 154(b) by 0 days.

(21) Appl. No.: 16/875,220

(22) Filed: May 15, 2020

(30) Foreign Application Priority Data

Nov. 19, 2019 (CN) .......................... 2019 1 1130366

(51) Int. Cl.
| | |
|---|---|
| *H03F 1/14* | (2006.01) |
| *H03F 1/02* | (2006.01) |
| *H03F 3/45* | (2006.01) |
| *G09G 3/20* | (2006.01) |

(52) U.S. Cl.
CPC ............ *H03F 1/0211* (2013.01); *G09G 3/20* (2013.01); *H03F 3/45269* (2013.01); *H03F 3/45273* (2013.01); *G09G 2310/0291* (2013.01); *G09G 2330/028* (2013.01); *H03F 2203/45156* (2013.01)

(58) Field of Classification Search
CPC ............... H03F 1/0211; H03F 3/45273; H03F 3/45269; H03F 2203/45156; G09G 3/20; G09G 2310/0291; G09G 2330/028
USPC .................. 330/292, 277, 296, 253
See application file for complete search history.

(56) References Cited

FOREIGN PATENT DOCUMENTS

| | | |
|---|---|---|
| CN | 203423624 U | 2/2014 |
| CN | 104950974 A | 9/2015 |
| CN | 108536206 A | 9/2018 |
| CN | 110311629 A | 10/2019 |
| EP | 0 448 135 B1 | 11/1995 |

OTHER PUBLICATIONS

First Office Action in Application No. CN 201911130366.X dated Jan. 7, 2020.
Notification to Grant Patent Right for Invention in Application No. CN 201911130366.X dated Jan. 14, 2020.

*Primary Examiner* — Khanh V Nguyen
*Assistant Examiner* — Khiem D Nguyen
(74) *Attorney, Agent, or Firm* — Knobbe Martens Olson & Bear LLP

(57) ABSTRACT

Provided is a compensation circuit for an operational amplifier including a primary pole. The compensation circuit includes: a control circuit; and a compensation capacitor including a first terminal connected to the primary pole, and a second terminal connected to an output terminal of the control circuit. The control circuit includes: a pull-up module including a control terminal connected to a second control signal terminal, an input terminal connected to an input power supply, and an output terminal connected to a first control node being the output terminal of the control circuit; a pull-down module including a control terminal connected to a first control signal terminal, and an output terminal connected to ground; and an input transistor including a control terminal connected to the primary pole, an input terminal connected to a first control node, and an output terminal connected to an input terminal of the pull-down module.

14 Claims, 7 Drawing Sheets

COMPENSATION CIRCUIT FOR OPERATIONAL AMPLIFIER, INTEGRATED CIRCUIT AND DISPLAY PANEL

CROSS-REFERENCE TO RELATED APPLICATIONS

The present application claims the benefit of priority to Chinese Patent Application No. 201911130366.X, filed on Nov. 19, 2019, the content of which is incorporated herein by reference in its entirety.

TECHNICAL FIELD

The present disclosure relates to the technical field of circuits, and in particular, to a compensation circuit for an operational amplifier, an integrated circuit, and a display panel.

BACKGROUND

Operational amplifiers have been widely used in integrated circuits. Generally, an operational amplifier includes a primary pole and a secondary pole. The larger difference between the primary pole and the secondary pole leads to the higher operating stability the operational amplifier. Since the pole is a reciprocal of a product of a resistance and a capacitance, the primary pole can be reduced by increasing the capacitance of the primary pole without changing a normal function of a circuit.

In the related art, the capacitance of the primary pole of the operational amplifier is increased by providing a capacitor in the integrated circuit or providing an external capacitor. However, if the primary pole has a large capacitance, providing a capacitor in the integrated circuit will lead to a larger area for the integrated circuit, and a large external capacitor will increase complexity of the circuit.

SUMMARY

An embodiment of the present disclosure provides a compensation circuit for an operational amplifier, an integrated circuit, and a display panel, aiming to increase an equivalent capacitance of the primary pole of the operational amplifier and improve stability of the operational amplifier.

In a first aspect, an embodiment of the present disclosure provides a compensation circuit for an operational amplifier. The operational amplifier includes at least a primary pole, and the compensation circuit includes a compensation capacitor and a control circuit. The compensation capacitor includes a first terminal electrically connected to one primary pole of the at least one primary pole of the operational amplifier, and a second terminal electrically connected to an output terminal of the control circuit. The control circuit includes an input transistor, a pull-up module, and a pull-down module. The input transistor includes a control terminal electrically connected to the one primary pole of the operational amplifier, an input terminal electrically connected to a first control node, and an output terminal electrically connected to an input terminal of the pull-down module. The pull-down module includes a control terminal electrically connected to a first control signal terminal, and an output terminal connected to ground. The pull-up module includes a control terminal electrically connected to a second control signal terminal, an input terminal electrically connected to an input power supply, and an output terminal electrically connected to the first control node, the first control node being the output terminal of the control circuit. The first control signal terminal is configured to output a pull-down control signal, and the pull-down module is configured to pull down a voltage of the first control node under control of the pull-down control signal; and the second control signal terminal is configured to output a pull-up control signal, and the pull-up module is configured and to pull up the voltage of the first control node under control of the pull-up control signal.

In a second aspect, an embodiment of the present disclosure provides an integrated circuit, including: an operational amplifier including at least one primary pole; and the compensation circuit for the operational amplifier described above.

In a third aspect, an embodiment of the present disclosure provides a display panel, including: a plurality of pixels arranged in an array, wherein each of the plurality of pixels includes a driving circuit and a light-emitting element, pixels in a same row of the plurality of pixels share a same scanning signal line, and pixels in a same column of the plurality of pixels share a same data signal line of a plurality of data signal lines; and a plurality of the integrated circuits being in one-to-one correspondence with the plurality of data signal lines, each of the plurality of integrated circuits being the integrated circuit as mentioned in the first aspect. The operational amplifier of the integrated circuit includes a first input terminal electrically connected to a data signal pin, a second input terminal connected to ground, and an output terminal electrically connected to at least one of the plurality of data signal lines.

The embodiments of the present disclosure provide a compensation circuit for the operational amplifier, an integrated circuit, and a display panel. The compensation circuit for the operational amplifier includes a compensation capacitor and a control circuit. Two terminals of the compensation capacitor are respectively electrically connected to the primary pole of the operational amplifier and the output terminal of the control circuit. The input terminal of the control circuit is electrically connected to the primary pole of the operational amplifier. The control circuit can output a corresponding voltage signal based on the voltage signal of the primary pole of the operational amplifier, so as to control voltage signals of two terminals of the compensation capacitor to have opposite changing trends. In this way, one terminal of the compensation capacitor is a charging terminal of the compensation capacitor and the other terminal of the compensation capacitor is a discharging terminal of the compensation capacitor, thereby increasing the charging capacity of the compensation capacitor, which is equivalent to increasing the capacitance of the primary pole of the operational amplifier. In this way, with a simple compensation circuit, the capacitance of the primary pole of the operational amplifier can be increased without changing a normal function of the circuit, thereby further improving the stability of the operational amplifier.

DESCRIPTION OF EMBODIMENTS

The present disclosure will be further described in details in the following with reference to the accompanying drawings and embodiments. It can be understood that the specific embodiments described herein are only used to illustrate the present disclosure rather than limiting the present disclosure. It should be noted that for convenience of description, only some parts related to the present disclosure are shown in the accompany drawings instead of all structures.

Figure 1:
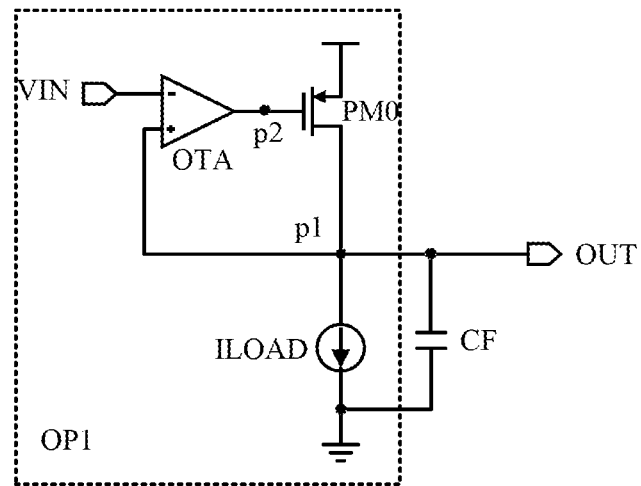
FIG. 1 is a schematic diagram of a structure of an operational amplifier in the related art.

FIG. 1 is a schematic diagram of a structure of an operational amplifier in the related art. As shown in FIG. 1, the operational amplifier OP1 includes two poles p1 and p2. The two poles P1 and P2 are a primary pole and a secondary pole. Here, a larger difference between the primary pole and the secondary pole leads to the more stable operation for the operational amplifier. Since a pole is a reciprocal of a product of a resistance and a capacitance, a difference between the primary pole and the secondary pole is increased in the related art by increasing the capacitance of the primary pole. As shown in FIG. 1, in an example, p1 is the primary pole of the operational amplifier OP1. A capacitor CF is provided at the primary pole p1, one terminal of the capacitor CF is electrically connected to the primary pole p1, and another terminal of the capacitor CF is connected to ground. However, if the capacitor CF has a large dimension, a dimension and complexity of the circuit will be increased, which will not meet the development requirements of a highly integrated circuit.

In order to solve the above technical problems, an embodiment of the present disclosure provides a compensation circuit for an operational amplifier. The compensation circuit for the operational amplifier can increase the capacitance of the primary pole of the operational amplifier. The compensation circuit for the operational amplifier includes a compensation capacitor and a control circuit. The compensation capacitor includes a first terminal electrically connected to the primary pole of the operational amplifier, and a second terminal electrically connected to an output terminal of the control circuit. The control circuit includes an input terminal electrically connected to the primary pole of the operational amplifier, and a power supply terminal that is electrically connected to an input power supply. The control circuit is configured to control a changing trend of a voltage of the second terminal of the compensation capacitor based on a voltage signal of the primary pole of the operational amplifier, in such a manner that a changing trend of a voltage of the first terminal of the compensation capacitor is opposite to the changing trend of the voltage of the second terminal of the compensation capacitor.

With the above technical solution, in a first aspect, electrically connecting one terminal of the compensation capacitor to the primary pole of the operational amplifier can increase the capacitance of the primary pole of the operational amplifier. In a case where the secondary pole of the operational amplifier is unchanged, a difference between the primary pole and the secondary pole of the operational amplifier can be increased, thereby facilitating improving the operating stability of the operational amplifier. In a second aspect, the first terminal of the compensation capacitor is electrically connected to the primary pole of the operational amplifier, the second terminal of the compensation capacitor is electrically connected to the output terminal of the control circuit, and the control circuit controls the changing trend of the second terminal of the compensation capacitor to be opposite to the changing trend of the first terminal of the compensation capacitor based on the voltage signal of the primary pole of the operational amplifier. This is equivalent to that one terminal of the compensation capacitor is charged and another terminal of the compensation capacitor is discharged. That is, the capacitance of the compensation capacitor is increased, so that with a simple compensation circuit, the control circuit can control two terminals of a compensation capacitor of a small dimension to have opposite changing trends, thereby achieving a larger equivalent capacitance. In this way, the capacitance of the primary pole of the operational amplifier can be increased without increasing the dimension and complexity of the circuit, so that the difference between the primary pole and the secondary pole of the operational amplifier is increased without changing the secondary pole, thereby facilitating improving the operating stability of the operational amplifier.

The above description involves a core idea of the present disclosure. The technical solutions in the embodiments of the present disclosure will be described in the following with reference to the accompanying drawings in the embodiments of the present disclosure. Based on the embodiments of the present disclosure, all other embodiments obtained by those skilled in the art without creative efforts shall fall within a protection scope of the present disclosure.

Figure 2:
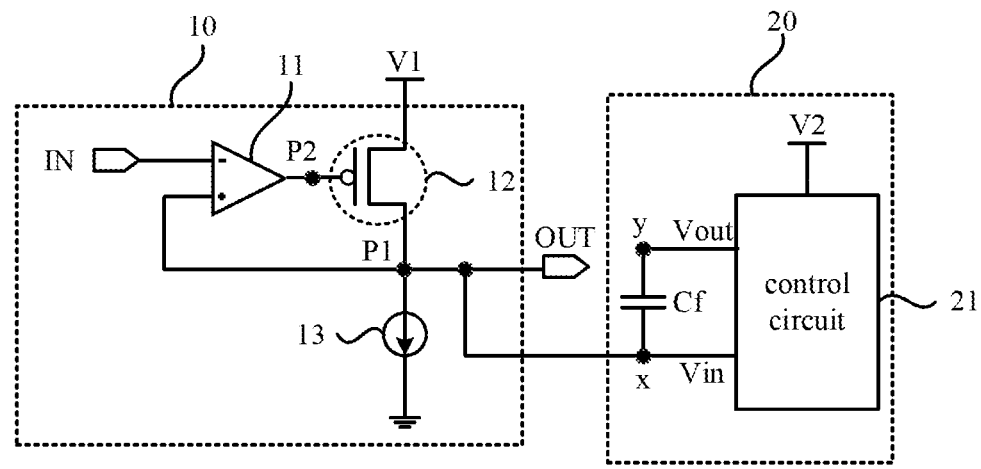
FIG. 2 is a schematic diagram of a structure of a compensation circuit for an operational amplifier according to an embodiment of the present disclosure.

FIG. 2 is a schematic diagram of a structure of a compensation circuit for an operational amplifier according to an embodiment of the present disclosure. As shown in FIG. 2, an operational amplifier 10 may be an integrated operational amplifier. The integrated operational amplifier 10 may include an amplifier 11, a transistor 12, and a current source load 13. Here, an inverting input terminal of the amplifier 11 is electrically connected to an input terminal IN of the operational amplifier 10, an output terminal of the amplifier 11 is electrically connected to a control electrode of the transistor. The transistor 12 includes a first electrode electrically connected to a bias power supply V1, and a second electrode electrically connected to ground through the current source load 13 and also electrically connected to a non-inverting input terminal of the amplifier 11 and an output terminal OUT of the integrated operational amplifier 10. The integrated operational amplifier 10 includes a primary pole P1 and a secondary pole P2, and a difference between the primary pole P1 and the secondary pole P2 affects stability of the integrated operational amplifier 10.

In this embodiment of the present disclosure, the capacitance of the primary pole P1 of the integrated operational amplifier 10 is compensated by a compensation circuit 20 of the operational amplifier. The compensation circuit 20 for the operational amplifier includes a compensation capacitor Cf and a control circuit 21. Here, the compensation capacitor Cf includes a first terminal x electrically connected to the primary pole P1 of the integrated operational amplifier 10, and a second terminal y electrically connected to an output terminal Vout of the control circuit 21. The control circuit 21 includes an input terminal Vin electrically connected to the primary pole P1 of the integrated operational amplifier 10, and a power supply terminal electrically connected to an input power supply V2. A signal inputted to the input terminal Vin of the control circuit 21 is a signal of the primary pole of the integrated operational amplifier 10, and is also a signal of the first terminal x of the compensation capacitor Cf A signal outputted from the output terminal Vout of the control circuit 21 is a signal of the second terminal y of the compensation capacitor Cf. The control circuit 21 outputs a signal having a changing tread opposite to the changing trend of the primary pole P1 based on the signal of the primary pole P1 of the integrated operational amplifier 10, so that a changing trend of the first terminal x of the compensation capacitor Cf is opposite to a changing trend of the second terminal y of the compensation capacitor Cf.

In an example, when the signal of the primary pole P1 of the operational amplifier 10 is in an increasing trend, the signal of the first terminal x of the compensation capacitor Cf is also in the increasing trend, the signal inputted to the input terminal Vin of the control circuit 21 is in the increasing trend, the signal outputted from the output terminal Vout of the control circuit 21 is in a decreasing trend, and the signal of the second terminal y of the compensation capacitor Cf is in the decreasing trend. In this case, when the first terminal x of the compensation capacitor Cf is in the increasing trend, the signal of the primary pole P1 of the integrated operational amplifier 10 charges the first terminal x of the compensation capacitor Cf; and when the signal of the output terminal Vout of the control circuit 21 is in the decreasing trend, the second terminal y of the compensation capacitor Cf is in the decreasing trend, that is, the control circuit 21 controls the second terminal y of the compensation capacitor Cf to discharge. Thus, compared with a capacitor of a same capacitance, a charging capacity of the compensation capacitor Cf can be increased, thereby equivalently increasing the capacitance of the compensation capacitor Cf without increasing the dimension of the capacitor. In this way, the capacitance of the primary pole P1 of the integrated operational amplifier 10 is increased, thereby facilitating stable operation of the operational amplifier 10. In contrast, when the signal of the primary pole P1 of the operational amplifier 10 is in the decreasing trend, the signal of the first terminal x of the compensation capacitor Cf is also in the decreasing trend, the signal inputted to the input terminal Vin of the control circuit 21 is in the decreasing trend, the signal outputted from the output terminal Vout of the control circuit 21 is in the increasing trend, and the signal of the second terminal y of the compensation capacitor Cf is in the increasing trend. The first terminal x and the second terminal y of the compensation capacitor Cf have opposite changing trends, thereby equivalently increasing the capacitance of the compensation capacitor Cf without increasing the dimension of the capacitor. This can increase the capacitance of the primary pole P1 of the integrated operational amplifier 10, thereby facilitating the stable operation of the integrated operational amplifier 10.

It should be noted that FIG. 2 is only an exemplary figure according to an embodiment of the present disclosure. In FIG. 2, the pole P1 of the operational amplifier 10 is the primary pole of the operational amplifier 10, and the pole P2 is the secondary pole of the operational amplifier 10. In other embodiments, the pole P2 may the primary pole of the operational amplifier 10 and the pole P1 may be the secondary pole of the operational amplifier 10. Meanwhile, the specific circuit structure of the operational amplifier 10 shown in FIG. 2 is also an exemplary circuit structure. The compensation circuit for the operational amplifier provided by this embodiment of the present disclosure is applicable to any operational amplifier having a primary pole, and the circuit structure of the operational amplifier is not limited by the embodiments of the present disclosure. For ease of description, in the embodiments of the present disclosure, the pole P1 is the primary pole of the operational amplifier 10, and for cases in which the pole P2 is the primary pole of the operational amplifier 10, reference can be made to the embodiments in which the pole P1 is the primary pole of the operational amplifier 10, the technical principles thereof are similar and will not be repeated in the embodiments of the present disclosure.

Figure 3:
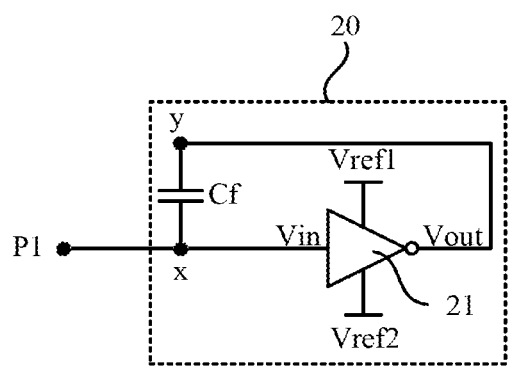
FIG. 3 is a schematic diagram of a structure of another compensation circuit for an operational amplifier according to an embodiment of the present disclosure.

FIG. 3 is a schematic diagram of a structure of another compensation circuit for an operational amplifier according to an embodiment of the present disclosure. In an example, as shown in FIG. 3, the control circuit of the compensation circuit 20 for the operational amplifier may include a common-source inverting operational amplifier 21. The common-source inverting operational amplifier 21 includes a first reference power supply signal terminal Vref1 being the power supply terminal of the control circuit, an input terminal Vin being the input terminal of the control circuit, an output terminal Vout being the output terminal of the control circuit, and a second reference power supply signal terminal Vref2 connected to ground.

The common-source inverting operational amplifier 21 can invert a signal of the input terminal Vin of the common-source inverting operational operator 21 and output the signal from the output terminal Vout of the common-source inverting operational operator 21. The input terminal Vin of the common-source inverting operational amplifier 21 is electrically connected to the primary pole P1 of the operational amplifier, and the first terminal x of the compensation capacitor Cf is electrically connected to the primary pole P1 of the operational amplifier. Meanwhile, the output terminal Vout of the common-source inverting operational amplifier 21 is the output terminal of the control circuit, that is, the output terminal Vout of the common-source inverting operational amplifier 21 is electrically connected to the second terminal y of the compensation capacitor Cf Therefore, the signal inputted to the input terminal Vin of the common-source inverting operational amplifier 21 is the signal of the primary pole P1 of the operational amplifier, the signal inputted to the input terminal Vin of the common-source inverting operational amplifier 21 is identical to the signal of the first terminal x of the compensation capacitor Cf, and the signal of the output terminal Vout of the common-source inverting operational amplifier 21 is identical to the signal of the second terminal y of the compensation capacitor Cf. When the signal of the input terminal Vin of the common-source inverting operational amplifier 21 increases, that is, the signal of the first terminal x of the compensation capacitor Cf increases, the output terminal Vout of the common-source inverting operational amplifier 21 outputs a signal opposite to the signal of the input terminal Vin, that is, the signal outputted from the output terminal Vout of the common-source inverting operational amplifier 21 decreases. At this time, the signal of the second terminal y of the compensation capacitor Cf decreases, so that the signal of the second terminal y of the compensation capacitor Cf and the signal of the first terminal x of the compensation capacitor Cf have opposite changing trends, which equivalently increases the capacitance of the compensation capacitor Cf, thereby facilitating improving the operating stability of the operational amplifier.

Figure 4:
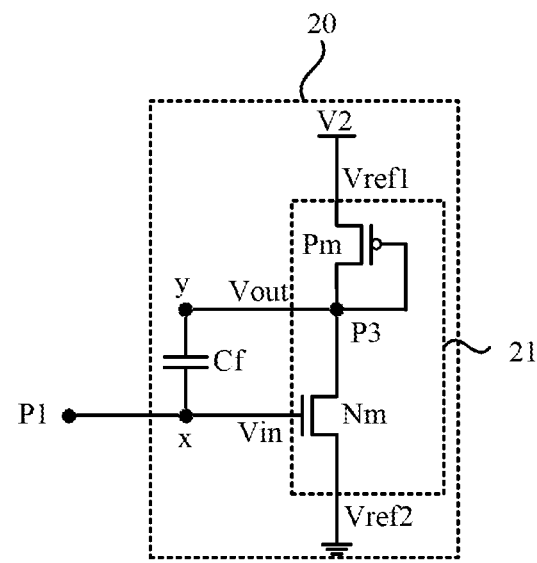
FIG. 4 is a specific circuit diagram of a compensation circuit for an operational amplifier according to an embodiment of the present disclosure.

In an example, in specific implementation, the common-source inverting operational amplifier may include a common-source input transistor and a current source load. FIG. 4 is a specific circuit diagram of a compensation circuit for an operational amplifier according to an embodiment of the present disclosure. The common-source inverting operational amplifier 21 includes a common-source input transistor Nm and a current source load Pm. Here, the common-source input transistor Nm includes: a control terminal that is the input terminal Vin of the common-source inverting operational amplifier 21, an output terminal that is a second reference power supply signal terminal Vref1 of the common-source inverting operational amplifier 21, and an input terminal electrically connected to a first control node P3. The current source load Pm includes: an input terminal that is a first reference power supply signal terminal Vref2 of the common-source inverting operational amplifier 21, an output terminal electrically connected to the first control node P3, and a control terminal electrically connected to the first control node P3. Here, the first control node P3 is the output terminal Vout of the common-source inverting operational amplifier 21.

In an example, the common-source input transistor Nm of the common-source inverting operational amplifier 21 may be an N-type transistor, and the current source load Pm of the common-source inverting operational amplifier 21 may be a P-type transistor. In this case, when the voltage of the primary pole P1 is increases, the voltage of the first terminal x of the compensation capacitor Cf increases, and the voltage inputted by the input terminal Vin of the common-source inverting operational amplifier 21 also increases. At this time, the voltage of the control terminal of the common-source input transistor Nm is increased, and a current flowing through the common-source input transistor Nm is increased. Since the output terminal of the common-source input transistor Nm is the second reference power supply signal terminal Vref1 of the common-source inverting operational amplifier 21, that is, the output terminal of the common-source input transistor Nm is connected to ground, the signal of the first control node P3 is pulled down by the common-source input transistor Nm. At this time, the voltage outputted from the output terminal Vout of the common-source inverting operational amplifier 21 is decreased, and the voltage of the second terminal y of the compensation capacitor Cf is decreased, so that the changing trend of the signal of the first terminal x of the compensation capacitor Cf is opposite to the changing trend signal of the second terminal y of the compensation capacitor Cf, thereby equivalently increasing the capacitance of the compensation capacitor Cf Correspondingly, when the voltage of the primary pole P1 is decreased, the signal coupled to the second terminal y of the compensation capacitor Cf by the first terminal x of the compensation capacitor Cf decreases the voltage of the control terminal of the current source load Pm, and thus a current flowing through the P-type current source load Pm is increased. Since the input terminal of the current source load Pm is the first reference power supply signal terminal Vref2 of the common-source inverting operational amplifier 21, that is, the input terminal of the current source load Pm is electrically connected to a input voltage V2, when a current flowing through the P-type current source load Pm is increased, the signal of the first control node P3 is pulled up by the current source load Pm. At this time, the voltage outputted from the output terminal Vout of the common-source inverting operational amplifier 21 is increased, and the voltage of the second terminal y of the compensation capacitor Cf is increased, so that the changing trend of the signal of the first terminal x of the compensation capacitor Cf is opposite to the changing trend of the signal of the second terminal y of the compensation capacitor Cf, which equivalently increasing the capacitance of the compensation capacitor Cf.

Figure 5:
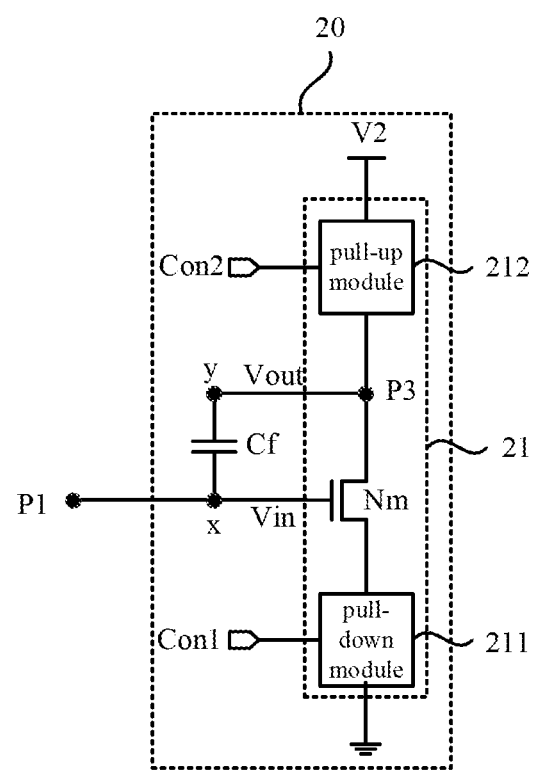
FIG. 5 is a schematic diagram of a structure of another compensation circuit for an operational amplifier according to an embodiment of the present disclosure.

FIG. 5 is a schematic diagram of a structure of a compensation circuit for another operational amplifier according to an embodiment of the present disclosure. In an example, as shown in FIG. 5, the control circuit 21 of the compensation circuit 20 for the operational amplifier includes an input transistor Nm, a pull-up module 212, and a pull-down module 211. The input transistor Nm includes: a control terminal that is the input terminal yin of the control circuit 21, an input terminal electrically connected to the first control node P3, and an output terminal electrically connected to an input terminal of the pull-down module 211. The pull-down module 211 includes a control terminal electrically connected to a first control signal terminal Con1, and an output terminal connected to ground. The pull-up module 212 includes a control terminal electrically connected to a second control signal terminal Con2, an input terminal electrically connected to the input power supply V2, and an output terminal electrically connected to the first control node P3. Here, the first control node P3 is the output terminal Vout of control circuit 21. The pull-down module 211 pulls down the voltage of the first control node P3A under control of a pull-down control signal outputted from the first control signal terminal Con1. The pull-up module 212 pulls up the voltage of the first control node P3 under control of a pull-up control signal outputted from the second control signal terminal Con2.

In an example, when the voltage of the primary pole P1 of the operational amplifier is increased, that is, the voltage of the first terminal x of the compensation capacitor Cf is increased, the voltage of the control terminal of the input transistor Nm is increased. At this time, a pull-down control signal outputted from the first control signal terminal Con1 controls the pull-down module 211 to quickly pull down the voltage of the first control node P3, and a pull-up control signal outputted from the second control signal terminal Con2 controls the pull-up module 212 not to pull up the voltage of first control node P3, or the pull-up control signal outputted from the second control signal terminal Con2 controls the pull-up module 212 to slowly pull up the voltage of first control node P3. At this time, a speed of pulling up the voltage of the first control node P3 is smaller than a speed of pulling down the voltage of the first control node, so that the voltage of the first control node P3 is decreased. That is, the voltage of the second terminal y of the compensation capacitor Cf is decreased, and the changing trend of the voltage of the first terminal x of the compensation capacitor Cf is opposite to the changing trend of the voltage of the second terminal y of the compensation capacitor Cf Correspondingly, when the voltage of the primary pole P1 of the operational amplifier is decreased, that is, the voltage of the first terminal x of the compensation capacitor Cf is decreased, a pull-up control signal outputted from the second control signal terminal Con2 controls the pull-up module 212 to quickly pull up the voltage of the first control node P3, and a pull-down control signal outputted from the first control signal terminal Con1 controls the pull-down module 211 not to pull down the voltage of the first control node P3, or the pull-down control signal outputted from the first control signal terminal Con1 controls the pull-down module 211 to slowly pull down the voltage of the first control node P3. At this time, a speed of pulling up the voltage of the first control node P3 is larger than a speed of pulling down the voltage of the first control node P3, so that the voltage of the first control node P3 is increased. That is, the voltage of the second terminal y of the compensation capacitor Cf is increased, and the changing trend of the voltage of the first terminal x of the compensation capacitor Cf is opposite to the changing trend of the voltage of the second terminal y of the compensation capacitor Cf, which equivalently increasing the capacitance of the compensation capacitor Cf, thereby facilitating improving operation stability of an operational unit using the compensation circuit for the operational amplifier.

Figure 6:
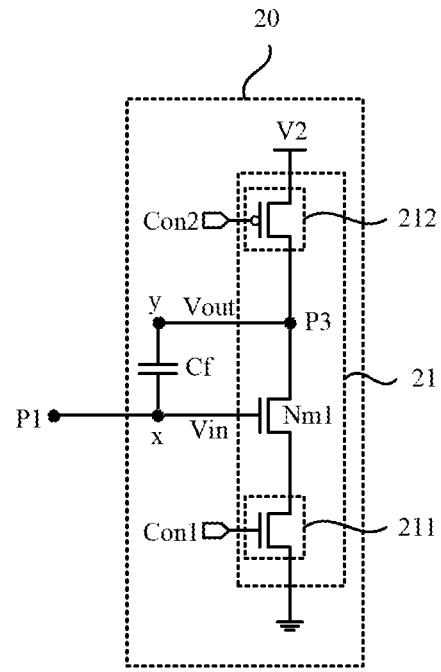
FIG. 6 is a specific circuit diagram of another compensation circuit for an operational amplifier according to an embodiment of the present disclosure.

FIG. 6 is a specific circuit diagram of another compensation circuit for an operational amplifier according to an embodiment of the present disclosure. In an example, as shown in FIG. 6, the pull-up module 212 of the control circuit 21 may include at least one pull-up transistor, and the pull-down module 211 of the control circuit 21 may include at least one pull-down transistor.

In an example, the pull-up module 212 of the control circuit 21 includes a P-type pull-up transistor, and the pull-down module 211 of the control circuit 21 includes an N-type pull-down transistor. The P-type pull-up transistor includes: a gate electrode that is the control terminal of the pull-up module 212, a source electrode that is the input terminal of the pull-up module 212, and a drain electrode that is the output terminal of the pull-up module 212. The N-type pull-down transistor includes: a gate electrode that is the control terminal of the pull-down module 211, a source electrode that is the input terminal of the pull-down module 211, and a drain electrode that is the output terminal of the pull-down module 211.

When the voltage of the primary pole P1 of the operational amplifier is increased, that is, the voltage of the first terminal x of the compensation capacitor Cf is increased, a current flowing through the input transistor Nm and the N-type pull-down transistor 211 can be increased by increasing a voltage of the gate electrode of the N-type pull-down transistor, i.e., by increasing a pull-down signal of the first control signal terminal Con1. In this way, a pull-down effect on the first control node P3 can be increased, thereby decreasing a voltage signal of the first control node P3, that is, a voltage signal of the second terminal y of the compensation capacitor Cf is decreased. Meanwhile, a current flowing through the P-type pull-up transistor 212 can be decreased by increasing a voltage of the gate electrode of the P-type pull-up transistor 212, i.e., by increasing a pull-up signal of the second control signal terminal Con2. In this way, a pull-up effect on the first control node P3 can be decreased, that is, a pull-up effect on the second terminal y of the compensation capacitor Cf is decreased, so that the voltage signals of two terminals of the compensation capacitor Cf have opposite changing trends, which is equivalent to increasing the capacitance of the compensation capacitor Cf, thereby facilitating the stable operation of an operational amplifier using the compensation circuit 20 for the operational amplifier.

Correspondingly, when the voltage of the primary pole P1 of the operational amplifier is decreased, that is, the voltage of the first terminal x of the compensation capacitor Cf is decreased, the pull-down signal of the first control signal terminal Con1 can be decreased, a current flowing through the input transistor Nm and a current flowing through the N-type pull-down transistor 211 are decreased, and the pull-down effect on the first control node P3 is decreased. Meanwhile, the pull-up signal of the second control signal terminal Con2 is decreased, a current flowing through the P-type pull-up transistor 212 is increased, and a pull-up effect on the second terminal y of the compensation capacitor Cf is increased, so that the voltage signals of two terminals of the compensation capacitor Cf can have opposite changing trends. In this way, the voltage signals of two terminals of the compensation capacitor Cf can have opposite changing trends by controlling a relation among the pull-down signal of the first control signal terminal Con1, the pull-up signal of the second control signal terminal Con2, and changing of the voltage of the primary pole P1 of the operational amplifier. Meanwhile, a changing speed of the signal of the second terminal y of the compensation capacitor Cf can be increased by increasing a change speeding of the pull-down signal of the first control signal terminal Con1 and a changing speed of the second control signal terminal Con2, thereby further increasing an equivalent capacitance of the compensation capacitor Cf.

It should be noted that FIG. 6 is merely an exemplary drawing according to an embodiment of the present disclosure. FIG. 6 exemplarily illustrates that the pull-up module 212 includes one P-type pull-up transistor, and the pull-down module 211 includes one N-type pull-down transistor. In the embodiments of the present disclosure, the pull-up module may include two or more transistors, and types of the transistors of the pull-up module are not limited as long as the pull-up module can achieve a pull-up effect. Similarly, the pull-down module may include two or more transistors, and types of transistors of the pull-down module are not limited as long as the pull-down module can achieve a pull-down effect.

Figure 7:
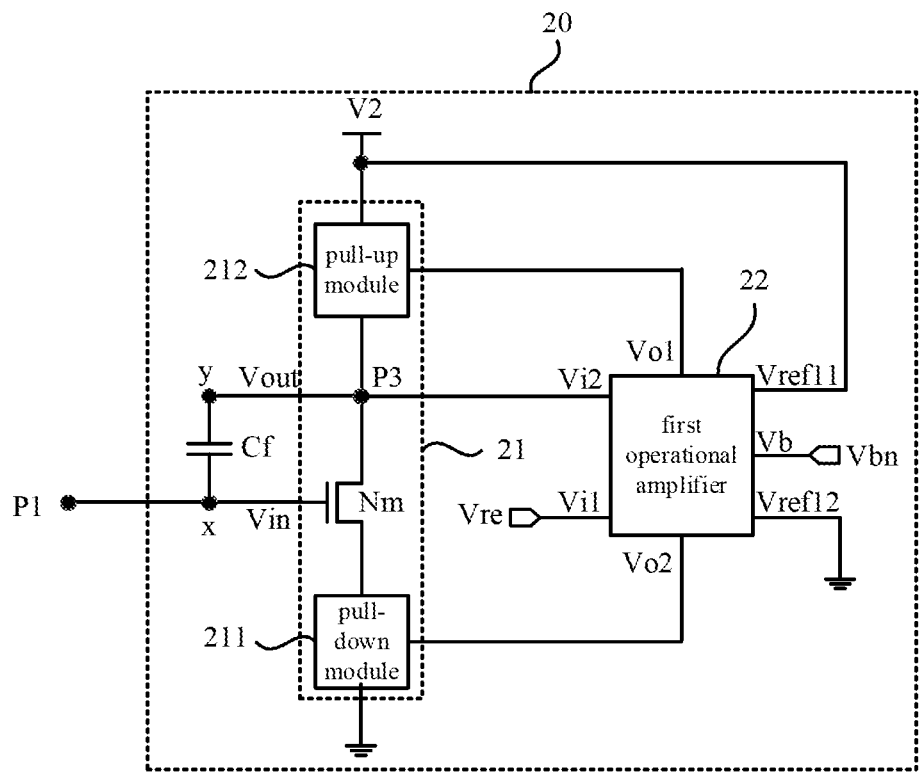
FIG. 7 is a schematic diagram of a structure of another compensation circuit for an operational amplifier according to an embodiment of the present disclosure.

FIG. 7 is a schematic diagram of a structure of another compensation circuit for an operational amplifier according to an embodiment of the present disclosure. In an example, as shown in FIG. 7, one a basis of the above embodiments, the control circuit further includes a first operational amplifier 22. The first operational amplifier 22 includes: a first input terminal Vi1 electrically connected to a reference voltage Vre; a second input terminal Vi2 electrically connected to the first control node P3; a bias terminal Vb electrically connected to a bias power supply Vbn; a first reference power supply signal terminal Vref11 electrically connected to an input power supply V2; a second reference power supply signal terminal Vref12 connected to ground; a first output terminal Vo1 electrically connected to the control terminal of the pull-up module 212; and a second output terminal Vo2 electrically connected to the control terminal of the pull-down module 211. The first operational amplifier 22 is configured to respectively output a pull-up control signal and a pull-down control signal based on the voltage coupled to the first control node P3 from the first terminal x of the compensation capacitor Cf.

Specifically, the voltage signal of the primary pole P1 of the operational amplifier is coupled to the first control node P3 through the compensation capacitor Cf, and then the signal is inputted to the second input terminal Vi2 of the first operational amplifier 22. The first operational amplifier can control a changing trend of the pull-up control signal outputted from the first output terminal Vo1 of the first operational amplifier 22 and a changing trend of the pull-down control signal outputted from the second output terminal Vo2 based on the reference voltage Vre inputted from the first input terminal Vi1, the signal of the first control node P3 of the second input terminal Vi2, and the bias power supply Vbn inputted from the bias terminal Vb. In this way, under a premise that the voltage signals of two terminals of the compensation capacitor Cf have opposite changing trends, a changing speed of the signal of the second terminal y of the compensation capacitor Cf is controlled in such a manner that an equivalent capacitance of the compensation capacitor Cf can be further increased.

Figure 8:
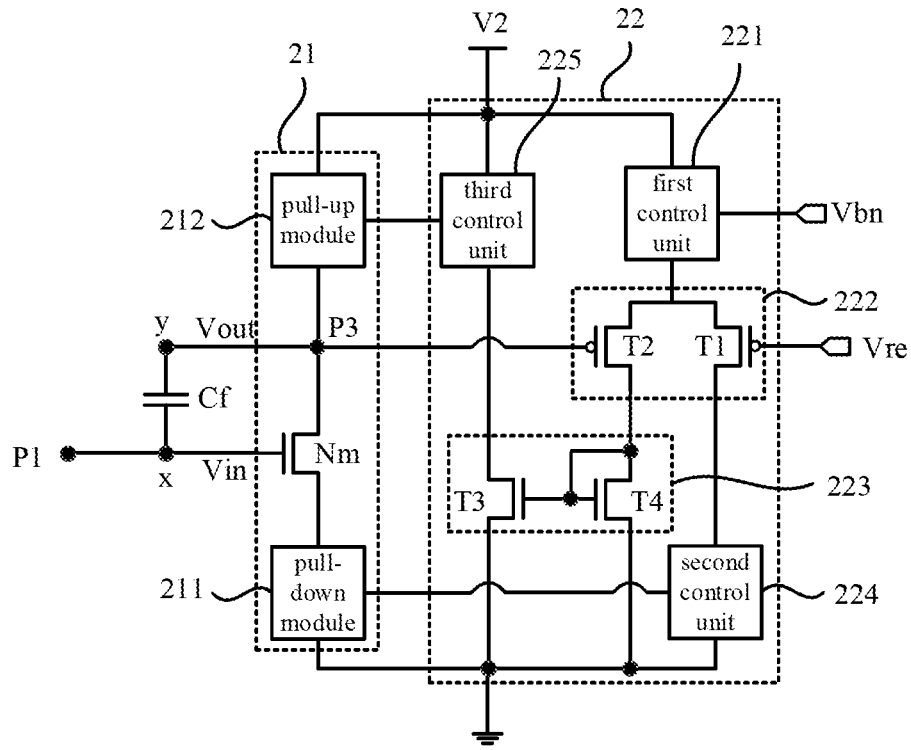
FIG. 8 is a schematic diagram of a structure of another compensation circuit for an operational amplifier according to an embodiment of the present disclosure.

FIG. 8 is a schematic diagram of a structure of another compensation circuit for an operational amplifier according to an embodiment of the present disclosure. As shown in FIG. 8, in a specific implementation, the first operational amplifier 22 may include a first control unit 221, a first differential transistor pair 222, a mirror current source circuit 223, a second control unit 224, and a third control unit 225. The first differential transistor pair 222 includes a first transistor T1 and a second transistor T2. The mirror current source circuit 223 includes a third transistor T3 and a fourth transistor T4. Each of the transistors T1, T2, T3 and T4 includes a control terminal, an input terminal, and an output terminal.

The control terminal of the first transistor T1 is the first input terminal of the first operational amplifier 22, and the control terminal of the second transistor T2 is the second input terminal of the first operational amplifier 22. The first control unit 221 includes a control terminal electrically connected to the bias power supply Vbn, an input terminal electrically connected to the input power supply V2, and an output terminal electrically connected to the input terminals of the first and second transistors T1 and T2 of the first differential transistor pair 222. The control unit 221 is configured to control a sum of currents flowing through the first transistor T1 and the second transistor T2 based on a voltage signal of the bias power supply Vbn.

The second control unit 224 includes: a control terminal electrically connected to the control terminal of the pull-down module 211, an input terminal electrically connected to the output terminal of the first transistor T1, and an output terminal connected to ground. The second control unit 224 is configured to control a pull-down control signal inputted from the control terminal of the pull-down module 211 based on a current flowing through the first transistor T1.

The third control unit 225 includes a control terminal electrically connected to the control terminal of the pull-up module 212, an input terminal electrically connected to the input power supply V2, and an output terminal electrically connected to the input terminal of the third transistor T3 of the mirror current source circuit 223. The control terminal of the third transistor T3 is electrically connected to the control terminal of the fourth transistor T4, and the control terminal of the fourth transistor T4 is also electrically connected to the input terminal of the fourth transistor T4. The input terminal of the fourth transistor T4 is electrically connected to the output terminal of the second transistor T2, and the output terminal of the fourth transistor T4 is connected to ground. The third control unit 225 is configured to control a pull-up control signal inputted from the control terminal of the pull-up module 212 based on a current flowing through the second transistor T2.

The control terminal of the first transistor T1 is the first input terminal of the first operational amplifier 22, that is, the control terminal of the first transistor T1 is electrically connected to the reference voltage Vre. The control terminal of the second transistor T2 is the second input terminal of the first operational amplifier 22, that is, the control terminal of the second transistor T2 is electrically connected to the first control node P3. A magnitude of the bias power supply Vbn inputted to the control terminal of the first control unit 221 can control a sum of currents flowing through the first transistor T1 and the second transistor T2. When the bias power supply Vbn has a constant value, the sum of currents flowing through the first transistor T1 and the second transistor T2 does not change. Here, the first transistor T1 and the second transistor T2 of the first differential transistor pair 222 may be P-type transistors, and the third transistor T3 and the fourth transistor T4 of the mirror current source circuit 223 may be N-type transistors.

When the voltage of the primary pole P1 of the operational amplifier is increased, the voltage coupled to the first control node P3 through the compensation capacitor Cf is increased, and the signal inputted to the control terminal of the second transistor T2 is increased. The second transistor T2 is a P-type transistor, so when the signal inputted to the control terminal of the second transistor T2 is increased, a current flowing through the second transistor T2 is decreased. At this time, a current flowing through the first transistor T1 is relatively increased. Since a current flowing through the second transistor T2 is the same as a current flowing through the fourth transistor T4, and the fourth transistor T4 and the third transistor T3 constitute the mirror current source circuit 223, the current flowing through the second transistor T2 is the same as the current flowing through the third transistor T3. Meanwhile, the current flowing through the third transistor T3 is transmitted to the third control unit 225, and the third control unit 225 can control a pull-up control signal inputted to the control terminal of the pull-up module 212 based on a changing trend of a current flowing through the third transistor T3, i.e., based on a changing trend of a current flowing through the second transistor T2, so as to decrease the pull-up effect of the pull-up module 212 on the first control node P3. When the current flowing through the first transistor T1 is increased, the current flowing through the first transistor T1 is transmitted to the second control unit 224, and the second control unit 224 can control a pull-down control signal inputted to the control terminal of the pull-down module 211 based on a change trending of a current flowing through the first transistor T1, so as to increase a pull-down effect of the pull-down module 211 on the first control node P3. In this way, a speed of pulling down the first control node P3 by the pull-down module 211 is larger than a speed of pulling up the first control node P3 by the pull-up module 212, so that the voltage of the first control node P3 is decreased. The changing trend of the first terminal x of the compensation capacitor Cf is the same as the changing trend of the primary pole P1 of the operational amplifier, and the changing trend of the second terminal y of the compensation capacitor Cf is the same as the changing trend of the first control node P3, so that two terminals of the compensation capacitor Cf have opposite changing trends, which is equivalent to increasing the charging capacity of the compensation capacitor Cf.

When the voltage of the primary pole P1 of the operational amplifier is decreased, the voltage coupled to the first control node P3 through the compensation capacitor Cf is decreased, and the signal inputted to the control terminal of the second transistor T2 is decreased. The second transistor T2 is a P-type transistor, so when the signal inputted to the control terminal of the second transistor T2 is decreased, a current flowing through the second transistor T2 is increased. At this time, a current flowing through the first transistor T1 is relatively decreased. In this way, the third control unit 225 can control a pull-up control signal inputted to the control terminal of the pull-up module 212 based on a changing trend of a current flowing through the second transistor T2, so as to increase a pull-up effect of the pull-up module 212 on the first control node P3. Similarly, the second control unit 224 can control a pull-down control signal inputted to the control terminal of the pull-down module 211 based on a changing trend of a current flowing through the first transistor T1, so as to decrease a pull-down effect of the pull-down module 211 on the first control node P3, so that the voltage of the first control node P3 is increased. Thus, two terminals of the compensation capacitor Cf have opposite changing trends, which is equivalent to increasing the charging capacity of the compensation capacitor Cf.

In this way, the pull-down control signal inputted to the control terminal of the pull-down module 211 and the pull-up control signal inputted to the control terminal of the pull-up module 212 are both related to the voltage of the primary pole P1 of the operational amplifier, so that a changing trend of the voltage of the first control node P3 can be consistent with a changing trend of the voltage of the primary pole P1 of the operational amplifier. That is, a charging capacity of the compensation capacitor Cf is consistent with a discharging capacity of the compensation capacitor Cf. Without considering an influence of other external factors, an equivalent capacitance of the compensation capacitor Cf can be infinite, thereby further improving operating stability of the operational amplifier.

Figure 9:
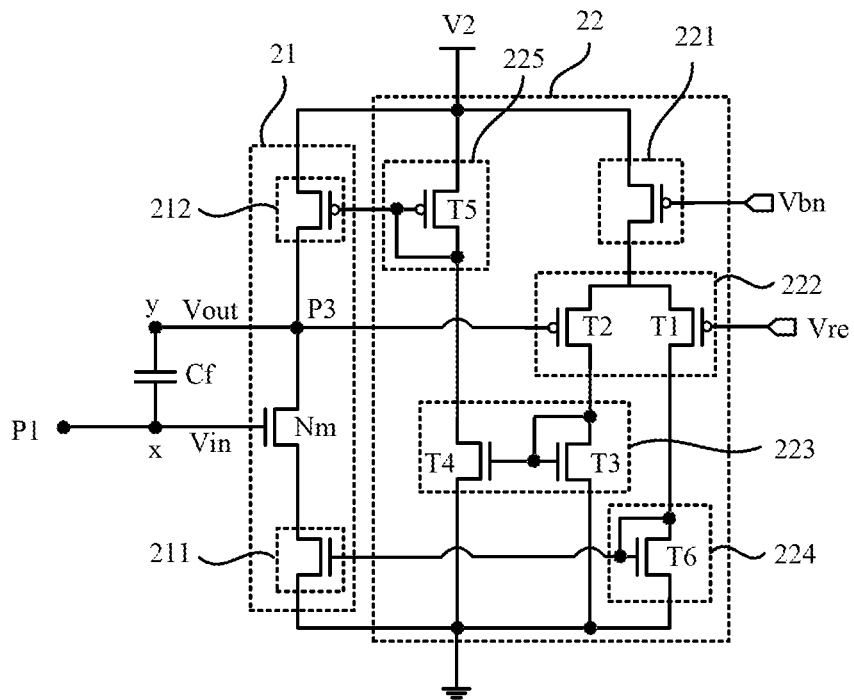
FIG. 9 is a specific circuit diagram of another compensation circuit for an operational amplifier according to an embodiment of the present disclosure.

FIG. 9 is a specific circuit diagram of another compensation circuit for an operational amplifier according to an embodiment of the present disclosure. As shown in FIG. 9, in a specific embodiment, the pull-up module 212 includes a pull-up transistor, the third control unit 225 includes a fifth transistor T5, and the fifth transistor T5 and the pull-up transistor 212 are both P-type transistors. Here, an input terminal of the fifth transistor T5 is electrically connected to a control terminal of the fifth transistor T5. The pull-down module 211 includes a pull-down transistor, the second control unit 224 includes a sixth transistor T6, and the sixth transistor T6 and the pull-down transistor 211 are both N-type transistors. Here, an input terminal of the sixth transistor T6 is electrically connected to a control terminal of the sixth transistor T6.

In an example, the first transistor T1 and the second transistor T2 of the first differential transistor pair 222 may be P-type transistors, and the third transistor T3 and the fourth transistor T4 of the mirror current source circuit 223 may be N-type transistors. When the voltage of the primary pole P1 of the operational amplifier is increased, the voltage coupled to the first control node P3 through the compensation capacitor Cf is increased, so that a voltage of a gate electrode of the second transistor T2 is increased. The second transistor T2 is a P-type transistor, that is, when the voltage of the gate electrode of the second transistor T2 is increased, a current flowing through the second transistor T2 is decreased, and a current transmitted to the fifth transistor T5 through the N-type third transistor T3 and fourth transistor T4 of the mirror current source circuit 223 is decreased. The fifth transistor T5 is a P-type transistor, that is, when a current flowing through the fifth transistor T5 is decreased, a voltage of a gate electrode of the fifth transistor T5 is increased. A voltage of a gate electrode of the P-type pull-up transistor 212 is increased, a current flowing through the P-type pull-up transistor 212 is decreased, and thus a pull-up effect of the pull-up transistor 212 on the first control node P3 is decreased. If the first control unit 221 includes a P-type transistor and a bias power supply Vbn inputted to the control terminal of the first control unit 221 has a constant value, the current flowing through the P-type transistor 221 does not change, that is, a sum of currents flowing through the first transistor T1 and the second transistor T2 does not change. In this case, when the current flowing through the second transistor T2 is decreased, the current flowing through the first transistor T1 is increased, and a current transmitted to the N-type sixth transistor T6 is increased. A voltage of a gate electrode of the N-type sixth transistor T6 is increased, the voltage of the gate electrode of the N-type pull-down transistor 211 is increased, the current flowing through the N-type pull-down transistor 211 is increased, and thus the pull-down effect of the pull-down transistor 211 on the first control node P3 is increased. In this way, a speed of pulling down the first control node P3 by the pull-down transistor 21 is larger than a speed of pulling up the first control node P3 by the pull-up transistor 212, so that the voltage of the first control node P3 is decreased, that is, the first terminal x and the second terminal y of the compensation capacitor Cf have opposite changing trends.

When the voltage of the primary pole P1 of the operational amplifier is decreased, the voltage coupled to the first control node P3 through the compensation capacitor Cf is decreased, so that the voltage of the gate electrode of the second transistor T2 is decreased, and a current flowing through the second transistor T2 is increased. A current transmitted to the fifth transistor T5 through the N-type third transistor T3 and fourth transistor T5 of the mirror current source circuit 223 is increased, so that the voltage of the gate electrode of the fifth transistor T5 is decreased. A voltage of a gate electrode of pull-up transistor 212 is decreased, a current flowing through the pull-up transistor 212 is increased, and thus a pull-up effect of the pull-up transistor 212 on the first control node P3 is increased. If a current flowing through the second transistor T2 is increased, a current flowing through the first transistor T1 is decreased, and a current transmitted to the sixth transistor T6 is decreased. A voltage of a gate electrode of the sixth transistor T6 is decreased, and a voltage of a gate electrode of the pull-down transistor 211 is decreased. A current flowing through the pull-down transistor 211 is decreased, and a pull-down effect of the pull-down transistor 211 on the first control node P3 is decreased. In this way, a speed of pulling down the first control node P3 by the pull-down transistor 211 is smaller than a speed of pulling up the first control node P3 by the pull-up transistor 212, so that the voltage of the first control node P3 is increased, and thus the first terminal x and the second terminal y of the compensation capacitor Cf have opposite changing trends.

According to a virtual short principle of the operational amplifier, the voltage of the first control node P3 is equal to the reference voltage Vre, that is, the voltage of the first control node is has a constant value, which can reduce mismatch of the first operational amplifier 22. At the same time, while determining the voltage of the first control node P3 by the first operational amplifier 22, a voltage inputted by the gate the pull-up transistor 212 and a voltage inputted by the gate of the pull-down transistor 211 may be both related to changing of the voltage of the primary pole P1 of the operational amplifier, thereby increasing a speed of changing of the voltage of the first control node P3.

Figure 10:
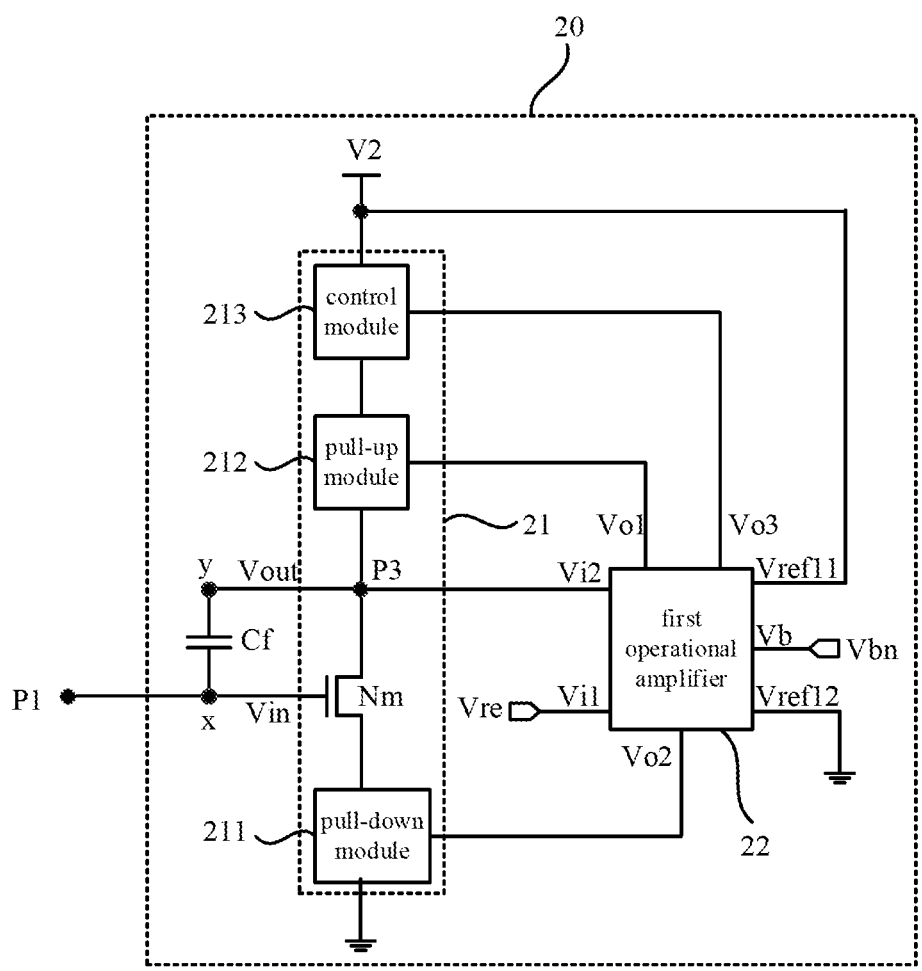
FIG. 10 is a schematic diagram of a structure of another compensation circuit for an operational amplifier according to an embodiment of the present disclosure.

FIG. 10 is a schematic diagram of a structure of another compensation circuit for an operational amplifier according to an embodiment of the present disclosure. In an example, as shown in FIG. 10, on a basis of the above embodiments, the control circuit 21 of the compensation circuit 20 of the operational amplifier further includes a control module 213. A third output terminal Vo3 of the first operational amplifier 22 is electrically connected to a control terminal of the control module 213, and the input terminal of the pull-up module 212 is electrically connected to the input power supply V2 through the control module 213. The control module 213 is configured to control output amounts of the pull-up control signal and the pull-down control signal based on a control signal outputted from the third output terminal Vo3 of the first operational amplifier 22. Here, a bias power supply signal inputted to a bias terminal of the first operational amplifier 22 is used to determine a control signal outputted from the third output terminal Vo3 of the first operational amplifier 22.

Specifically, a pull-down control signal outputted from the first output terminal Vi1 of the first operational amplifier 22 can control a pull-down effect of the pull-down module 211, and a pull-up control signal outputted from the second output Vo2 of the first operational amplifier 22 can control a pull-up effect of the pull-up module 212. The bias power supply signal inputted to the bias terminal of the first operational amplifier 22 can determine the control signal outputted from the third output terminal Vo3 of the first operational amplifier 22, and then the control signal outputted from the third terminal Vo3 of the first operational amplifier 22 is used to control the output amount of the pull-down control signal outputted from the first output terminal Vo1 of the first operational amplifier 22, and to control the output amount of the pull-up control signal outputted from the second output terminal Vo2 of the first operational amplifier 22. In this way, the operating stability of the first operational amplifier 22 can be improved.

Figure 11:
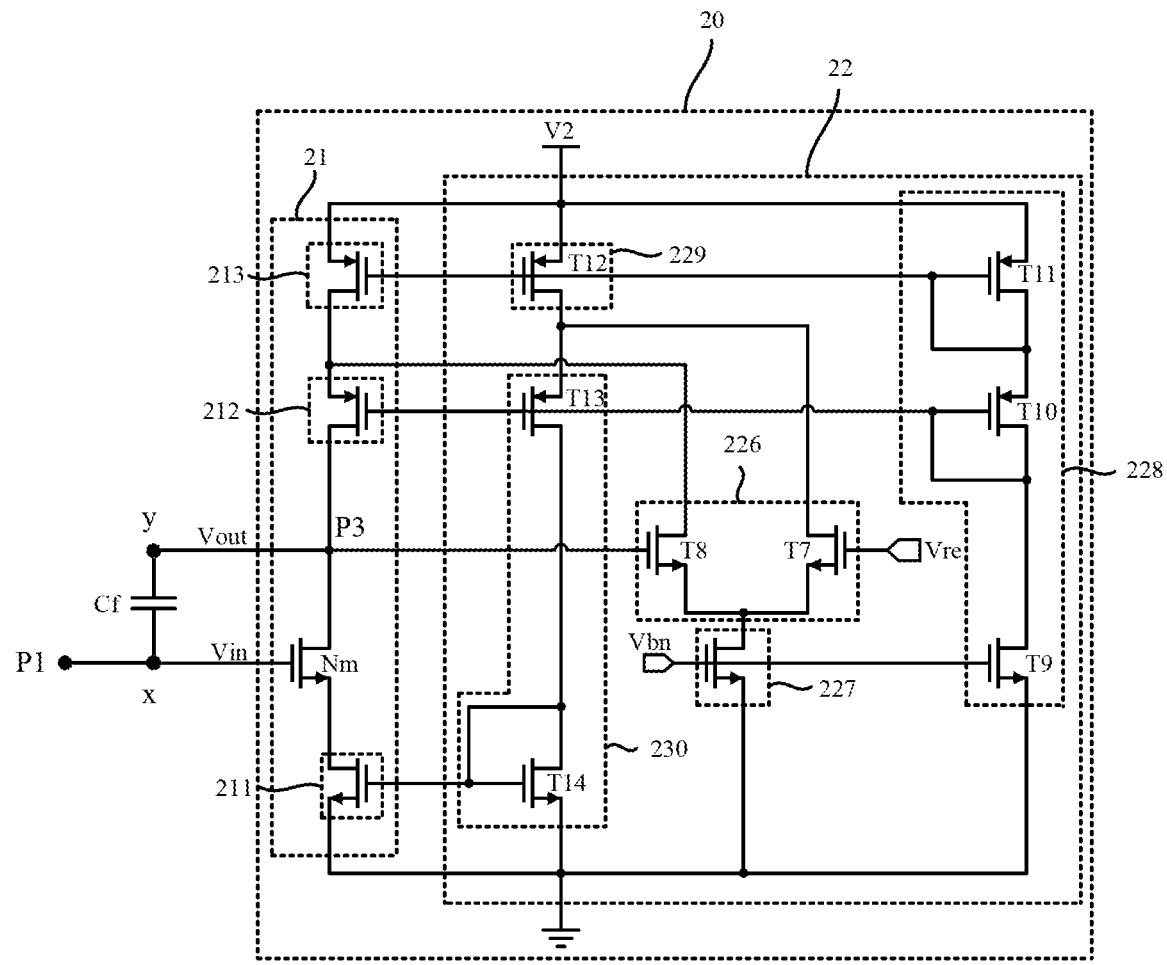
FIG. 11 is a specific circuit diagram of another compensation circuit for an operational amplifier according to an embodiment of the present disclosure.

FIG. 11 is a specific circuit diagram of another compensation circuit for an operational amplifier according to an embodiment of the present disclosure. As shown in FIG. 11, in a specific embodiment, the first operational amplifier 22 of the compensation circuit 20 of the operational amplifier may include a fourth control unit 227, a fifth control unit 228, a sixth control unit 229, a seventh control unit 230, and a second differential transistor pair 226. The second differential transistor pair 226 includes a seventh transistor T7 and an eighth transistor T8. A control terminal of the seventh transistor T7 is a first input terminal of the first operational amplifier 21, and a control terminal of the eighth transistor T8 is a second input terminal of the first operational amplifier 21.

The fourth control unit 227 includes: a control terminal electrically connected to the bias power supply Vbn, an input terminal electrically connected to an output terminal of the seventh transistor T7 and an output terminal of the eighth transistor T8, and an output terminal connected to ground. The fourth control unit 227 is configured to control a sum of currents flowing through the seventh transistor T7 and the eighth transistor T8 based on the voltage signal of the bias power supply Vbn.

The fifth control unit 228 includes: a control terminal electrically connected to the bias power supply Vbn; an input terminal electrically connected to the input power supply V2; a first output terminal electrically connected to a control terminal of the sixth control unit 229 and a control terminal of the control module 213; and a second output terminal electrically connected to the control terminal of the pull-up module 212 and a first control terminal of the seventh control unit 230. The fifth control unit 228 is configured to control a current flowing through the sixth control unit 229 and a current flowing through the control module 213 based on the voltage signal of the bias power supply Vbn.

The control module 213 includes: an input terminal electrically connected to the input power supply V2, and an output terminal electrically connected to the input terminal of the pull-up module 212 and an input terminal of the eighth transistor T8. The control module 213 is configured to control a sum of currents flowing through the pull-up module 212 and the eighth transistor T8.

The sixth control unit 229 includes: an input terminal electrically connected to the input power supply V2; and an output terminal electrically connected to an input terminal of the seventh transistor T7 and an input terminal of the seventh control unit 230. The sixth control unit 229 is configured to control a sum of currents flowing through the seventh control unit 230 and the seventh transistor T7. The seventh control unit 230 includes: a second control terminal electrically connected to the control terminal of the pull-down module 211, and an output terminal connected to ground.

Specifically, the control terminal of the seventh transistor T7 is the first input terminal of the first operational amplifier 22, that is, the control terminal of the seventh transistor T7 is electrically connected to the reference voltage Vre. The control terminal of the eighth transistor T8 is the second input terminal of the first operational amplifier 22, that is, the control terminal of the eighth transistor T8 is electrically connected to the first control node P3. A magnitude of the bias power supply Vbn inputted to the control terminal of the fourth control unit 227 can control a sum of currents flowing through the seventh transistor T7 and the eighth transistor T8. When the bias power supply Vbn has a constant value, the sum of currents flowing through the seventh transistor T7 and the eighth transistor T8 does not change, and a voltage signal outputted from an output terminal of the fifth control unit 228 remains unchanged. Here, the seventh transistor T7 and the eighth transistor T8 of the second differential transistor pair 226 may be N-type transistors.

In an example, when the voltage of the voltage of the primary pole P1 of the operational amplifier is increased, the voltage coupled to the first control node P3 through the compensation capacitor Cf is increased, and the signal inputted to the control terminal of the eighth transistor T8 is increased. The eighth transistor T8 is N-Type transistor, so when the signal inputted to the control terminal of the eighth transistor T8 is increased, a current flowing through the eighth transistor T8 is increased. At this time, a current flowing through the seventh transistor T7 is relatively decreased. Since a voltage signal outputted from the output terminal of the fifth control unit 228 remains unchanged, the voltage of the control terminal of the control module 213 and the voltage of the control terminal of the sixth control unit 229 remain unchanged. When a current flowing through the eighth transistor T8 is increased, a current flowing through the pull-up module 212 is decreased, that is, a pull-up effect of the pull-up module 212 is decreased. At the same time, when the current flowing through the eighth transistor T8 is increased, the current flowing through the seventh transistor T7 is relatively decreased. Since the voltage of the control terminal of the sixth control unit 229 remains unchanged, the sixth control unit 229 can control a sum of currents flowing through the seventh control unit 230 and the seventh transistor T7 to remain unchanged. When the current flowing through the seventh transistor T7 is decreased, a current flowing through the seventh control unit 230 is increased. At this time, a pull-down control signal outputted from the control unit 230 can increase the pull-down effect of the pull-down module 211. In this way, a speed of pulling down the first control node P3 by the pull-down module 211 is larger than that a speed of pulling up the first control node P3 by the pull-up module 212, so that the voltage of the first control node P3 is decreased. Since a changing trend of the first terminal x of the compensation capacitor Cf is the same as a changing trend of the primary pole P1 of the operational amplifier, a changing trend of the second terminal y of the compensation capacitor Cf is the same as a changing trend of the first control node P3, so that two terminals of the compensation capacitor Cf have opposite changing trends, which is equivalent to increasing the charging capacity of the compensation capacitor Cf.

When the voltage of the primary pole P1 of the operational amplifier is decreased, the voltage coupled to the first control node P3 through the compensation capacitor Cf is decreased, and the signal inputted to the control terminal of the eighth transistor T8 is decreased. The eighth transistor T8 is an N-type transistor, so when the signal inputted to the control terminal of the eighth transistor T8 is decreased, a current flowing through the eighth transistor T8 is decreased. At this time, a current flowing through the seventh transistor T7 is relatively increased. Since the voltage signal outputted from the output terminal of the fifth control unit 228 remains unchanged, the voltage of the control terminal of the control module 213 and the voltage of the control terminal of the sixth control unit 229 remain unchanged. When the current flowing through the eighth transistor T8 is decreased, the current flowing through the pull-up module 212 is increased, that is, the pull-up effect of the pull-up module 212 is increased. At the same time, when the current flowing through the eighth transistor T8 is decreased, the current flowing through the seventh transistor T7 is relatively increased. Since the voltage of the control terminal of the sixth control unit 229 remains unchanged, the sixth control unit 229 can control the sum of currents flowing through the seventh control unit 230 and the seventh transistor T7 to remain unchanged. When the current flowing through the seventh transistor T7 is increased, the current flowing through the seventh control unit 230 is decreased. At this time, a pull-down control signal outputted from the control unit 230 can decrease the pull-down effect of the pull-down module 211. In this way, a speed of pulling down the first control node P3 by the pull-down module 211 is smaller than a speed of pulling up the first control node P3 by the pull-up module 212, so that the voltage of the first control node P3 is increased. Since a changing trend of the first terminal x of the compensation capacitor Cf is the same as a changing trend of the primary pole P1 of the operational amplifier, a changing trend of the second terminal y of the compensation capacitor Cf is the same as a changing trend of the first control node P3, so that two terminals of the compensation capacitor Cf have opposite changing trends, which is equivalent to increasing the charging capacity of the compensation capacitor Cf.

In this way, the pull-down control signal inputted to the control terminal of the pull-down module 211 and the pull-up control signal inputted to the control terminal of the pull-up module 212 are both related to the voltage of the primary pole P1 of the operational amplifier, so that the changing trend of the voltage of the first control node P3 can be consistent with the changing trend of the voltage of the primary pole P1 of the operational amplifier. That is, the charging capacity of the compensation capacitor Cf is consistent with the discharging capacity of the compensation capacitor Cf. Without considering an influence of other external factors, an equivalent capacitance of the compensation capacitor Cf can be infinite, thereby further improving operating stability of the operational amplifier. Moreover, providing the control module 213 in the control circuit 21 can facilitate stable operation of the first operational amplifier 22.

In an example, with further reference to FIG. 11, the fifth control unit 228 includes a ninth transistor T9, a tenth transistor T10, and an eleventh transistor T11. The ninth transistor T9 includes: a control terminal electrically connected to the bias power supply Vbn, an input terminal electrically connected to an output terminal of the tenth transistor T10, and an output terminal connected to ground. The tenth transistor T10 includes: a control terminal electrically connected to the control terminal of the pull-up module 212 and the first control terminal of the seventh control unit 230; an input terminal electrically connected to an output terminal of the eleventh transistor T11; and the output terminal electrically to the control terminal of the tenth transistor T10. The eleventh transistor T11 includes: a control terminal electrically connected to the control terminal of the control module 213 and the control terminal of the sixth control unit 229, the output terminal electrically connected to the control terminal of the eleventh transistor T11; and an input terminal electrically connected to the input power supply V2.

In an example, with further reference to FIG. 11, the sixth control unit 229 includes a twelfth transistor T12, and the control module 213 includes a control transistor. The eleventh transistor T11, the twelfth transistor T12, and the control transistor 213 are all P-type transistors. The pull-up module 212 includes a pull-up transistor, and the pull-down module includes a pull-down transistor. The seventh control unit 230 includes a thirteenth transistor T13 and a fourteenth transistor T14. The thirteenth transistor T13 includes: an input terminal electrically connected to an output terminal of the second transistor T12, a control terminal electrically connected to the control terminal of the tenth transistor T10, and an output terminal electrically connected to an input terminal of the fourteenth transistor T14. The fourteenth transistor T14 includes: a control terminal electrically connected to the control terminal of the pull-down transistor 211, an input terminal electrically connected to the control terminal of the fourteenth transistor T14, and an output terminal connected to ground. The tenth transistor T10, the thirteenth transistor T13, and the pull-up transistor 212 are all P-type transistors. The pull-down transistor 211 and the fourteenth transistor T14 are both N-type transistors.

In an example, when the voltage of the primary pole P1 of the operational amplifier is increased, the voltage coupled to the first control node P3 through the compensation capacitor Cf is increased, and the signal inputted to the control terminal of the eighth transistor T8 is increased. The eighth transistor T8 is an N-type transistor, so when the signal input to the control terminal of the eighth transistor T8 is increased, a current flowing through the eighth transistor T8 is increased, and a current flowing through the seventh transistor T7 is relatively decreased. When the voltage signal of bias power supply Vbn remains unchanged, currents flowing through the ninth transistor T9, the tenth transistor T10, and the eleventh transistor T11 remain unchanged. At this time, a voltage of the control terminal of the control transistor 213 and a voltage of the control terminal of the twelfth transistor T12 remain unchanged. When the current flowing through the eighth transistor T8 is increased, the current flowing through the pull-up transistor 212 is decreased, that is, the pull-up effect of the pull-up module 212 is decreased. At the same time, when the current flowing through the seventh transistor T7 is relatively decreased, a current flowing through the thirteenth transistor T13 is increased, that is, a current flowing through the fourteenth transistor T14 is increased. At this time, a voltage of the control terminal of the fourteenth transistor T14 is increased, and the voltage of the control terminal of the pull-down transistor 211 is increased. The current flowing through the pull-down transistor 211 is increased, thereby increasing the pull-down effect of the pull-down transistor 211. In this way, a speed of pulling down the first control node P3 by the pull-down transistor 211 is larger than a speed of pulling up the first control node by the pull-up transistor 212, so that the voltage of the first control node P3 is decreased. The changing trend of the first terminal x of the compensation capacitor Cf is the same as the changing trend of the primary pole P1 of the operational amplifier, and the changing trend of the second terminal y of the compensation capacitor Cf is the same as the changing trend of the first control node P3, so that two terminals of the compensation capacitor Cf have opposite changing trends, which is equivalent to increasing the charging capacity of the compensation capacitor Cf.

When the voltage of the primary pole P1 of the operational amplifier is decreased, the voltage coupled to the first control node P3 through the compensation capacitor Cf is decreased, and the signal inputted to the control terminal of the eighth transistor T8 is decreased. The eighth transistor T8 is an N-type transistor, so when the signal inputted to the control terminal of the eighth transistor T8 is decreased, the current flowing through the eighth transistor T8 is decreased. At this time, the current flowing through the seventh transistor T7 is relatively increased. When the voltage signal of the bias power supply Vbn does not change, currents flowing through the ninth transistor T9, the tenth transistor T10, and the eleventh transistor T11 remain unchanged. At this time, the voltage of the control terminal of the control transistor 213 and the voltage of the control terminal of the twelfth transistor T12 remain unchanged. When the current flowing through the eighth transistor T8 is decreased, the current flowing through the pull-up transistor 212 is increased, that is, the pull-up effect of the pull-up module 212 is increased. At the same time, when the current flowing through the seventh transistor T7 is relatively increased, and a current flowing through the thirteenth transistor T13 is decreased, that is, a current flowing through the fourteenth transistor T14 is decreased. At this time, the voltage of the control terminal of the fourteenth transistor T14 is decreased, the voltage of the control terminal of the pull-down transistor 211 is decreased, the current flowing through the pull-down transistor 211 is decreased, and the pull-down effect of the pull-down transistor 211 is decreased. In this way, a speed of pulling down the first control node P3 by the pull-down transistor 211 is smaller than a speed of pulling up the first control node P3 by the pull-up transistor 212, so that the voltage of the first control node P3 is increased. The changing trend of the first terminal x of the compensation capacitor Cf is the same as the changing trend of the primary pole P1 of the operational amplifier, the changing trend of the second terminal y of the compensation capacitor Cf is the same as the changing trend of the first control node P3, so that two terminals of the compensation capacitor Cf have opposite changing trends, which is equivalent to increasing the charging capacity of the compensation capacitor Cf.

It should be noted that a specific circuit structure of the first operational amplifier in the embodiments of the present disclosure is only an exemplary circuit structure. Under a premise of achieving the function of the first operational amplifier, the circuit structure of the first operational amplifier is not specifically limited by the embodiments of the present disclosure.

Figure 12:
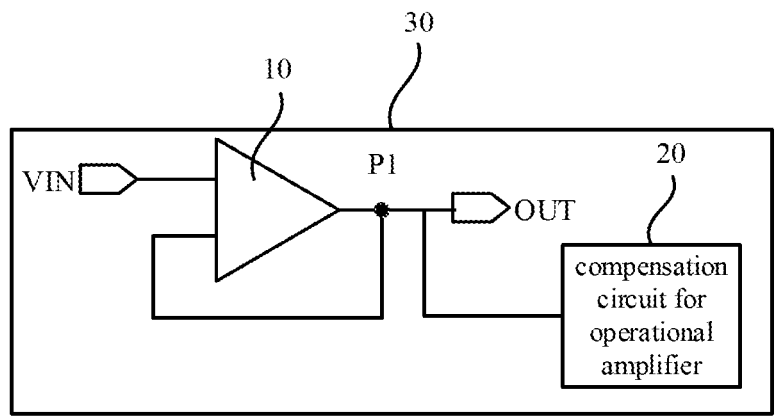
FIG. 12 is a schematic diagram of a structure of an integrated circuit according to an embodiment of the present disclosure.

On a basis of a same inventive concept, an embodiment of the present disclosure further provides an integrated circuit, which is formed on a silicon-based substrate. FIG. 12 is a schematic diagram of a structure of an integrated circuit according to an embodiment of the present disclosure. As shown in FIG. 12, the integrated circuit 30 includes an operational amplifier 10 and a compensation circuit 20 for an operational amplifier provided by embodiments of the present disclosure. The operational amplifier 10 includes at least one primary pole P1, and the compensation circuit 20 for the operational amplifier can compensate a capacitance of the primary pole P1, so that there is a large difference between the primary pole P1 and the secondary pole of the operational amplifier 10, thereby improving the operating stability of the operational amplifier 10. When the integrated circuit provided by this embodiment of the present disclosure includes the compensation circuit for the operational amplifier according to the embodiment of the present disclosure, the integrated circuit also involves the technical effect of the compensation circuit for the operational amplifier according to the embodiment of the present disclosure, and reference can be made to the above illustration of the compensation circuit for the operational amplifier for same aspects thereof, which will not be further described herein.

On a basis of a same inventive concept, an embodiment of the present disclosure further provides a display panel including a plurality of pixels arranged in an array. The pixel includes a driving circuit and a light-emitting element. The pixels in a same row share a same scanning signal line, and the pixels in a same column share a same data signal line. The display panel further includes a plurality of integrated circuits in one-to-one correspondence with the data signal lines. The operational amplifier of the integrated circuit includes: a first input terminal electrically connected to a data signal pin, a second input terminal connected to ground, and an output terminal electrically connected to the data signal line. A primary pole of the operational amplifier is electrically connected to a compensation circuit for an operational amplifier. When the display panel provided by this embodiment of the present disclosure includes the integrated circuit according to this embodiment of the present disclosure, since the integrated circuit involves the technical effect of the compensation circuit for the operational amplifier according to this embodiment of the present disclosure, the display panel also involves the technical effect of the compensation circuit for the operational according to this embodiment of the present disclosure, and reference can be made to the above illustration of the compensation circuit for the operational amplifier for same aspects thereof, which will not be further described herein.

Figure 13:
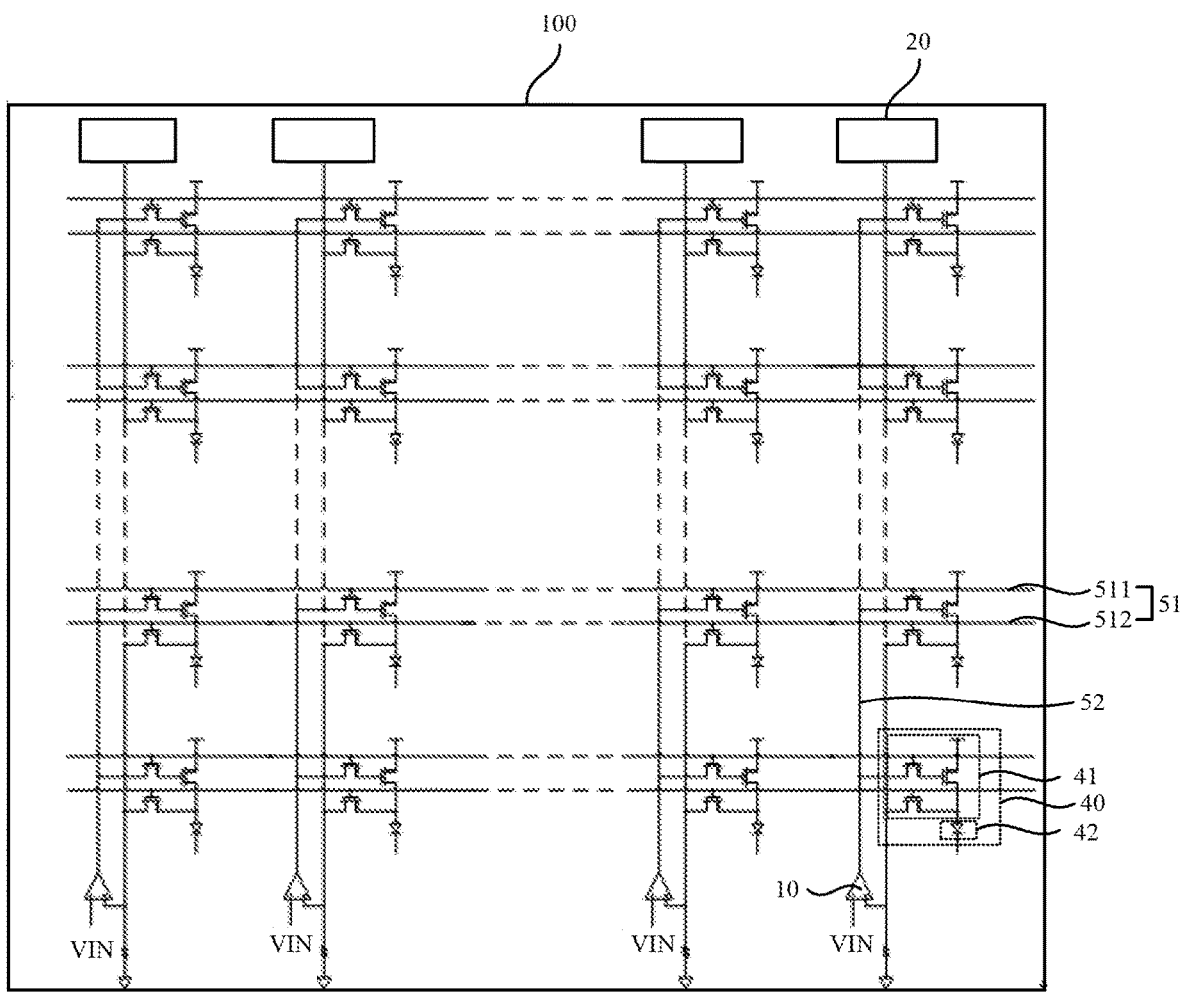
FIG. 13 is a schematic diagram of a structure of a display panel according to an embodiment of the present disclosure.

FIG. 13 is a schematic diagram of a structure of a display panel according to an embodiment of the present disclosure. In an example, as shown in FIG. 13, the display panel 100 includes a plurality of pixels 40 arranged in an array. The pixel 40 includes a driving circuit 41 and a light-emitting element 42. The pixels 40 in a same row share a same set 51 of scanning signal lines. The set 51 of scanning signal lines may include multiple scanning signal lines according to actual needs, for example, the set 51 of scanning signal lines may include a first scanning signal line 511 and a second scanning signal line 512. The pixels 40 in a same column share a same data signal line 52. The display panel 100 further includes a plurality of integrated circuits provided by this embodiment of the present disclosure that is in one-to-one correspondence with the data signal lines 52. The operational amplifier 10 of the integrated circuit includes: a first input terminal VIN electrically connected to a data signal pin, a second input terminal connected to ground, and an output terminal electrically connected to the data signal line 52. A primary pole of the operational amplifier 10 is electrically connected to the compensation circuit 20 for the operational amplifier. A data signal outputted from the data signal pin is amplified by the operational amplifier 10, then is outputted to a corresponding data signal line 52, and then is transmitted to the driving circuit 41 of a corresponding pixel 40 through the data signal line 52, so that the driving circuit 41 can drive the light-emitting element 42 in the pixel 40 to emit light.

In an embodiment, the display panel may be, for example, a silicon-based display panel, and the display panel further includes a silicon-based substrate. The integrated circuit, the driving circuit, and the light-emitting element of the display panel are formed on one side of the silicon-based substrate, and each device of the display panel can be formed on the silicon-based substrate by using the CMOS technology. Since a device directly formed on the silicon-based substrate has physical characteristics of a micro device, the display panel can display a high-quality image.

It should be noted that the above description is merely for illustrating preferred embodiments of the present disclosure and a technical principle applied thereto. Those skilled in the art will understand that the present disclosure is not limited to the specific embodiments described herein, for those skilled in the art, various obvious changes, readjustments, mutual combinations and substitutions can be made without departing from a scope of the present disclosure. Therefore, although the present disclosure has been described in details through the above embodiments, the present disclosure is not limited to the above embodiments. Without departing from a concept of the present disclosure, more equivalent embodiments may be included, and the scope of the present disclosure will be determined by a scope of the appended claims.

What is claimed is:

1. A compensation circuit for an operational amplifier, wherein the operational amplifier comprises a primary pole, and the compensation circuit comprises a compensation capacitor and a control circuit;
    the compensation capacitor comprises a first terminal electrically connected to the primary pole of the operational amplifier, and a second terminal electrically connected to an output terminal of the control circuit;
    the control circuit comprises an input transistor, a pull-up module, and a pull-down module;
    the input transistor comprises a control terminal electrically connected to the primary pole of the operational amplifier, an input terminal electrically connected to a first control node, and an output terminal electrically connected to an input terminal of the pull-down module;
    the pull-down module comprises a control terminal electrically connected to a first control signal terminal, and an output terminal connected to ground;
    the pull-up module comprises a control terminal electrically connected to a second control signal terminal, an input terminal electrically connected to an input power supply, and an output terminal electrically connected to the first control node, the first control node being the output terminal of the control circuit; and
    the first control signal terminal is configured to output a pull-down control signal, and the pull-down module is configured to pull down a voltage of the first control node under control of the pull-down control signal; and the second control signal terminal is configured to output a pull-up control signal, and the pull-up module is configured to pull up the voltage of the first control node under control of the pull-up control signal.

2. The compensation circuit according to claim 1, wherein the pull-up module comprises at least one pull-up transistor, and the pull-down module comprises at least one pull-down transistor.

3. The compensation circuit according to claim 1, wherein the control circuit further comprises a first operational amplifier;
    the first operational amplifier comprises: a first input terminal electrically connected to a reference voltage, a second input terminal electrically connected to the first control node, a bias terminal electrically connected to a bias power supply, a first reference power supply signal terminal electrically connected to the input power supply, a second reference power supply signal terminal connected to ground, a first output terminal electrically connected to the control terminal of the pull-up module, and a second output terminal electrically connected to the control terminal of the pull-down module; and
    the first terminal of the compensation capacitor is coupled to the first control node, and the first operational amplifier is configured to output the pull-up control signal and the pull-down control signal based on a voltage of the first control node.

4. The compensation circuit according to claim 3, wherein the first operational amplifier comprises a first control unit, a first differential transistor pair, a mirror current source circuit, a second control unit, and a third control unit;
    the first differential transistor pair comprises a first transistor and a second transistor, and the mirror current source circuit comprises a third transistor and a fourth transistor;
    the first control unit comprises: a control terminal electrically connected to the bias power supply, an input terminal electrically connected to the input power supply, and an output terminal electrically connected to an input terminal of the first transistor and an input terminal of the second transistor; and the first control unit is configured to control a sum of a current flowing through the first transistor and a current flowing through the second transistor based on a voltage signal of the bias power supply;
    the second control unit comprises: a control terminal electrically connected to the control terminal of the pull-down module, an input terminal electrically connected to an output terminal of the first transistor, and an output terminal connected to ground; and the second control unit is configured to control the pull-down control signal inputted to the control terminal of the pull-down module based on the current flowing through the first transistor;
    the third control unit comprises: a control terminal electrically connected to the control terminal of the pull-up module, an input terminal electrically connected to the input power supply, and an output terminal electrically connected to an input terminal of the third transistor; the third transistor comprises a control terminal electrically connected to a control terminal of the fourth transistor; the control terminal of the fourth transistor is further electrically connected to an input terminal of the fourth transistor, the input terminal of the fourth transistor is electrically connected to an output terminal of the second transistor, and an output terminal of the fourth transistor is connected to ground; and the third control unit is configured to control the pull-up control signal inputted to the control terminal of the pull-up module based on the current flowing through the second transistor; and wherein a control terminal of the first transistor is the first input terminal of the first operational amplifier, and a control terminal of the second transistor is the second input terminal of the first operational amplifier.

5. The compensation circuit according to claim 4, wherein the pull-up module comprises a pull-up transistor, the third control unit comprises a fifth transistor, and each of the fifth transistor and the pull-up transistor is a P-type transistor, wherein the fifth transistor comprises an input terminal and a control terminal that are electrically connected to each other; and the pull-down module comprises a pull-down transistor, the second control unit comprises a sixth transistor, and each of the sixth transistor and the pull-down transistor is an N-type transistor, wherein the sixth transistor comprises an input terminal and a control terminal that are electrically connected to each other.

6. The compensation circuit according to claim 4, wherein each of the first transistor and the second transistor is a P-type transistor, and each of the third transistor and the fourth transistor is an N-type transistor.

7. The compensation circuit according to claim 3, wherein the control circuit further comprises a control module;

the first operational amplifier comprises a third output terminal electrically connected to a control terminal of the control module, and the input terminal of the pull-up module is electrically connected to the input power supply through the control module;

the control module is configured to control output amounts of the pull-up control signal and the pull-down control signal based on a control signal outputted from the third output terminal of the first operational amplifier;

wherein a bias power supply signal inputted to the bias terminal of the first operational amplifier is used to determine the control signal outputted from the third output terminal of the first operational amplifier.

8. The compensation circuit according to claim 7, wherein the first operational amplifier comprises a fourth control unit, a fifth control unit, a sixth control unit, a seventh control unit, and a second differential transistor pair, and the second differential transistor pair comprises a seventh transistor and an eighth transistor;

the fourth control unit comprises a control terminal electrically connected to the bias power supply, an input terminal electrically connected to an output terminal of the seventh transistor and an output terminal of the eighth transistor, and an output terminal connected to ground, and the fourth control unit is configured to control a sum of a current flowing through the seventh transistor and a current flowing through the eighth transistor based on a voltage signal of the bias power supply;

the fifth control unit comprises a control terminal electrically connected to the bias power supply, an input terminal electrically connected to the input power supply, a first output terminal connected to a control terminal of the sixth control unit and the control terminal of the control module, and a second output terminal connected to the control terminal of the pull-up module and a first control terminal of the seventh control unit, and the fifth control unit is configured to control a current flowing through the sixth control unit and a current flowing through the control module based on the voltage signal of the bias power supply;

the control module comprises an input terminal electrically connected to the input power supply, and an output terminal electrically connected to the input terminal of the pull-up module and an input terminal of the eighth transistor, and the control module is configured to control a sum of a current flowing through the pull-up module and a current flowing through the eighth transistor;

the sixth control unit comprises an input terminal electrically connected to the input power supply, and an output terminal electrically connected to an input terminal of the seventh transistor and an input terminal of the seventh control unit, and the sixth control unit is configured to control a sum of a current flowing through the seventh control unit and a current flowing through the seventh transistor;

the seventh control unit comprises a second control terminal electrically connected to the control terminal of the pull-down module, and an output terminal connected to ground; and the seventh transistor comprises a control terminal being the first input terminal of the first operational amplifier, and the eighth transistor comprises a control terminal being the second input terminal of the first operational amplifier.

9. The compensation circuit according to claim 8, wherein the fifth control unit comprises a ninth transistor, a tenth transistor, and an eleventh transistor;

the ninth transistor comprises a control terminal electrically connected to the bias power supply, an input terminal electrically connected to an output terminal of the tenth transistor, and an output terminal connected to ground;

the tenth transistor comprises a control terminal electrically connected to the control terminal of the pull-up module and the first control terminal of the seventh control unit, and an input terminal electrically connected to an output terminal of the eleventh transistor, and the output terminal of the tenth transistor is further electrically connected to the control terminal of the tenth transistor; and the eleventh transistor comprises a control terminal electrically connected to the control terminal of the control module and the control terminal of the sixth control unit, and an input terminal electrically connected to the input power supply, and the control terminal of the eleventh transistor is further electrically connected to the output terminal of the eleventh transistor.

10. The compensation circuit according to claim 9, wherein the sixth control unit comprises a twelfth transistor, and the control module comprises a control transistor; each of the eleventh transistor, the twelfth transistor, and the control transistors is a P-type transistor; the pull-up module comprises a pull-up transistor, and the pull-down module comprises a pull-down transistor;

the seventh control unit comprises a thirteenth transistor and a fourteenth transistor; the thirteenth transistor comprises an input terminal electrically connected to an output terminal of the twelfth transistor, a control terminal electrically connected to the control terminal of the tenth transistor, and an output terminal electrically connected to an input terminal of the fourteenth transistor; the fourteenth transistor comprises a control terminal electrically connected to a control terminal of the pull-down transistor, the input terminal electrically connected to the control terminal of the fourteenth transistor, and an output terminal connected to ground; and each of the tenth transistor, the thirteenth transistor, and the pull-up transistor is a P-type transistor, and each of the pull-down transistor and the fourteenth transistor is an N-type transistor.

11. The compensation circuit according to claim 8, wherein each of the seventh transistor and the eighth transistor is an N-type transistor.

12. An integrated circuit, comprising:
an operational amplifier comprising a primary pole; and
a compensation circuit comprising a compensation capacitor and a control circuit,
wherein the compensation capacitor comprises a first terminal electrically connected to the primary pole of the operational amplifier, and a second terminal electrically connected to an output terminal of the control circuit;
the control circuit comprises an input transistor, a pull-up module, and a pull-down module;
the input transistor comprises a control terminal electrically connected to the primary pole of the operational amplifier, an input terminal electrically connected to a first control node, and an output terminal electrically connected to an input terminal of the pull-down module;
the pull-down module comprises a control terminal electrically connected to a first control signal terminal, and an output terminal connected to ground;

the pull-up module comprises a control terminal electrically connected to a second control signal terminal, an input terminal electrically connected to an input power supply, and an output terminal electrically connected to the first control node, the first control node being the output terminal of the control circuit; and the first control signal terminal is configured to output a pull-down control signal, and the pull-down module is configured to pull down a voltage of the first control node under control of the pull-down control signal; and the second control signal terminal is configured to output a pull-up control signal, and the pull-up module is configured to pull up the voltage of the first control node under control of the pull-up control signal.

13. A display panel, comprising:
a plurality of pixels arranged in an array, wherein each of the plurality of pixels comprises a driving circuit and a light-emitting element, pixels in a same row of the plurality of pixels share a same scanning signal line, and pixels in a same column of the plurality of pixels share a same data signal line of a plurality of data signal lines; and
a plurality of integrated circuits being in one-to-one correspondence with the plurality of data signal lines, each of the plurality of integrated circuits being the integrated circuit according to claim 12,
wherein the operational amplifier of the integrated circuit comprises a first input terminal electrically connected to a data signal pin, a second input terminal connected to ground, and an output terminal electrically connected to at least one of the plurality of data signal lines.

14. The display panel according to claim 13, further comprising:
a silicon-based substrate, wherein the plurality of integrated circuits, the driving circuit, and the light-emitting element are all formed on one side of the silicon-based substrate.

* * * * *